(12) United States Patent
Chen et al.

(10) Patent No.: US 8,076,177 B2
(45) Date of Patent: Dec. 13, 2011

(54) SCALABLE TRANSFER-JOIN BONDING LOCK-AND-KEY STRUCTURES

(75) Inventors: Kuan-Neng Chen, Hsinchu (TW); Fei Liu, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/780,100

(22) Filed: May 14, 2010

(65) Prior Publication Data

US 2011/0278740 A1   Nov. 17, 2011

(51) Int. Cl.
   *H01L 21/44*   (2006.01)
(52) U.S. Cl. ................................. 438/106; 257/741
(58) Field of Classification Search .................. None
   See application file for complete search history.

(56) References Cited

U.S. PATENT DOCUMENTS

| | | | |
|---|---|---|---|
| 5,453,404 A * | 9/1995 | Leedy | 438/479 |
| 5,495,394 A | 2/1996 | Kornfeld et al. | |
| 5,753,536 A | 5/1998 | Sugiyama et al. | |
| 5,977,640 A | 11/1999 | Bertin et al. | |
| 7,161,237 B2 | 1/2007 | Lee | |
| 2004/0219713 A1 * | 11/2004 | Lee | 438/106 |
| 2008/0105976 A1 * | 5/2008 | Pogge et al. | 257/741 |

OTHER PUBLICATIONS

Andreas Munding, "Interconnect Technology for Three-Dimensional Chip Integration," Dissertation Ulm University (2007).

* cited by examiner

*Primary Examiner* — Charles Garber
*Assistant Examiner* — Andre' C Stevenson
(74) *Attorney, Agent, or Firm* — Vazken Alexanian; Michael J. Chang, LLC

(57) ABSTRACT

Scalable transfer-join bonding techniques are provided. In one aspect, a transfer-join bonding method is provided. The method includes the following steps. A first bonding structure is provided having at least one metal pad embedded in an insulator and at least one via in the insulator over the metal pad. The via has tapered sidewalls. A second bonding structure is provided having at least one copper stud adapted to have a taper that complements the tapered sidewalls of the via, such that the via and the copper stud fit together like a lock-and-key. The first bonding structure is bonded to the second bonding structure by way of a metal-to-metal bonding between the metal pad and the copper stud that deforms the copper stud. A transfer-join bonded structure is also provided.

20 Claims, 5 Drawing Sheets

| | Sn0.3Cu | Sn0.3Au | Sn | In | Sn3.5Ag | 80Au20Sn |
|---|---|---|---|---|---|---|
| INITIAL MELTING POINT | 227°C | 227°C | 231.9°C | 156°C | 221°C | 287°C |
| THERMAL CONDUCTIVITY | •Cu$_6$Sn$_5$: 34.2 W/mK •Cu$_3$Sn: 69.8 W/mK | •Sn: 67 W/mK •Au: 315 W/mK | •Sn: 67 W/mK | •In: 82 W/mK | •NOT AVAILABLE | •NOT AVAILABLE |

1100

SCALABLE TRANSFER-JOIN BONDING LOCK-AND-KEY STRUCTURES

FIELD OF THE INVENTION

The present invention relates to transfer-join bonding techniques and more particularly, to scalable transfer-join bonding techniques.

BACKGROUND OF THE INVENTION

A transfer-join bonding technique is a combination of a mechanical lock-and-key and metal/adhesive hybrid three-dimensional interconnect that is suitable for fine pitch chip-chip, chip-wafer and wafer-wafer connections. An important feature of this process, is that the lock-and-key structure safeguards the wafer, chip or wafer/chip pair from lateral shifts during lamination (i.e., bonding). Pitch is the distance between two lock-and-key interconnect structures.

Transfer-join bonding relies on local pressure at the transfer-join bonding interface. As such, transfer-join bonding is sensitive to bonding area/pitch. A smaller bonding area usually results in bad bonding quality. For example, for lock-and-key interconnects of a given size, placing the interconnects at a smaller pitch can cause a bond to fail, whereas the same interconnects placed at a greater pitch will bond. In other words, bonding is dependent on layout and density, because local bonding pressure is proportional to an equivalent area occupied by each interconnect. Smaller pitch means smaller equivalent area which means less local bonding pressure and worse bonding quality.

Accordingly, for a smaller bond area, a larger pressure needs to be applied to the wafer, chip or wafer/chip pair in order to form a good bonding interface. A higher bonding force can be used to improve the bonding quality. Due to tooling limitations and/or the process pressure impact to the device, there is a maximum limit at which pressure can be applied to the transfer-join bonding. As a result, this maximum limit on pressure effectively sets a lower limit for the smallest bonding area that can be implemented. At the same time, with the scale-down of bonding print area, it is desirable to keep as large a bonding area as possible to make a good bonding interface and to minimize bonding interface resistance.

Therefore, transfer-join bonding techniques that are scalable and that maximize the bonding area would be desirable.

SUMMARY OF THE INVENTION

The present invention provides scalable transfer-join bonding techniques. In one aspect of the invention, a transfer-join bonding method is provided. The method includes the following steps. A first bonding structure is provided having at least one metal pad embedded in an insulator and at least one via in the insulator over the metal pad. The via has tapered sidewalls. A second bonding structure is provided having at least one copper stud adapted to have a taper that complements the tapered sidewalls of the via, such that the via and the copper stud fit together like a lock-and-key. The first bonding structure is bonded to the second bonding structure by way of a metal-to-metal bonding between the metal pad and the copper stud that deforms the copper stud.

In another aspect of the invention, a transfer-join bonded structure is provided. The structure includes a first bonding structure having at least one metal pad embedded in an insulator and at least one via in the insulator over the metal pad, wherein the via has tapered sidewalls; and a second bonding structure having at least one copper stud adapted to have a taper that complements the tapered sidewalls of the via, such that the via and the copper stud fit together like a lock-and-key, wherein the first bonding structure and the second bonding structure are bonded together by way of a metal-to-metal bonding between the metal pad and the copper stud that deforms the copper stud.

A more complete understanding of the present invention, as well as further features and advantages of the present invention, will be obtained by reference to the following detailed description and drawings.

DETAILED DESCRIPTION OF PREFERRED EMBODIMENTS

Figure 1:
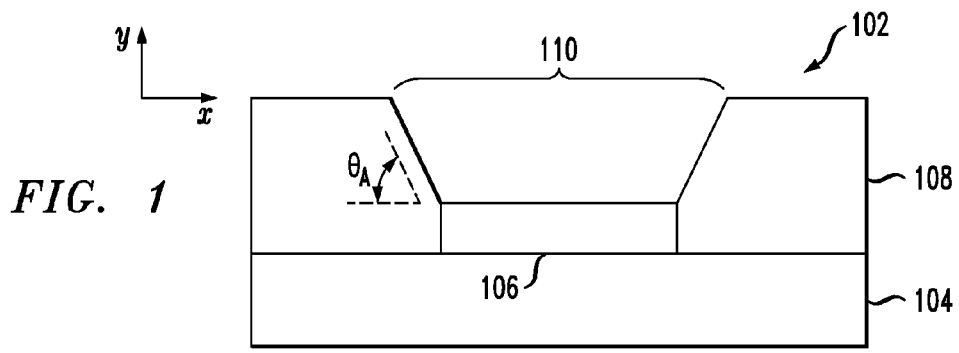
FIG. 1 is a cross-sectional diagram illustrating a first bonding structure having a copper (Cu) pad embedded in an insulator and a via in the insulator over the Cu pad according to an embodiment of the present invention.

Provided herein are transfer-join lock-and-key designs and techniques for the fabrication thereof that make transfer-join bonding scalable to micron and sub-micron bonding interfaces. FIGS. 1-7 provide an exemplary transfer-join lock-and-key design that provides a larger effective local pressure at the bonding interface (which permits transfer-join bonding at smaller (scaled) pitches at a given tool bonding pressure) while at the same time maximizing bonded area (which permits scaling of transfer-join bonding to smaller pitches and reducing bonding resistance penalty). FIG. 1, for example, is a cross-sectional diagram illustrating a first bonding structure 102 having copper (Cu) pad 106. First bonding structure 102 can be, for example, a wafer or a chip, such that the present techniques can involve the bonding of a wafer pair, a chip pair or a wafer/chip pair.

Further, as will become apparent from the following description, the techniques presented herein involve the fabrication of two separate bonding structures that are then bonded together using a transfer-join lock-and-key design that involves metal-to-metal (i.e., Cu-to-Cu) bonding or a metal-to-metal/adhesive hybrid bonding. To schematically illustrate the process, each bonding structure is considered to have a top surface (or face) and a bottom surface (or back) opposite the top surface. In some implementations of the present techniques (see, for example, FIGS. 1-7), one of the two structures is flipped for bonding to the other. Since, in this instance, the top surfaces (or faces) of the structures are mated during the bonding, the process is termed "face-to-face" bonding. However, what is shown in FIGS. 1-7 is only one exemplary bonding configuration, and other bonding configurations, such as face-to-back bonding, may be implemented in the same manner. The specific bonding configuration employed, i.e., face-to-face, face-to-back, etc., depends on the particular application at hand and can, given the present teachings, be implemented by one of skill in the art.

Further, for ease and consistency of description, the first bonding structure will be referred to herein also as the bottom bonding structure since, in this particular embodiment, the second bonding structure (see below) is placed on top of the first bonding structure during bonding. Accordingly, the second bonding structure is also referred to herein as the top bonding structure.

The fabrication of first bonding structure 102 begins, for example, with a wafer having an insulator, i.e., oxide layer 104 (e.g., a silicon dioxide ($SiO_2$) layer). A substrate (not shown) may be present adjacent to oxide layer 104. Cu is plated onto oxide layer 104 and additional processing, if necessary (such as chemical-mechanical polishing (CMP) of the Cu), is performed to form Cu pad 106. Additional insulator, i.e., additional oxide material 108 (e.g., $SiO_2$), is deposited over oxide layer 104/Cu pad 106. Cu pad 106 is now embedded in the insulator. A via 110 is then formed in the insulator (in this example, in the additional oxide material) over Cu pad 106. Via 110 can be formed using an oxide-selective reactive ion etching process (RIE) with Cu pad 106 acting as an etch stop. According to the exemplary embodiment shown illustrated in FIG. 1, via 110 is formed having sidewalls that are tapered at an angle $\theta_A$ of less than 90 degrees relative to a plane x (i.e., a surface plane) of the first bonding structure. To achieve the tapered sidewalls by RIE, for example, the mix of chemistry can be changed, e.g., less tetrafluoromethane ($CF_4$), or the bias power during the RIE can be reduced. Accordingly, the sidewalls of the via can have more or less taper.

While first bonding structure 102 is shown to have a single Cu pad embedded in an insulator and a via in the insulator over the Cu pad having sidewalls that are tapered at an angle $\theta_A$ of less than 90 degrees, it is to be understood that multiple pads/vias may be fabricated on a single bonding structure using the techniques as described herein. In fact, in some implementations it may be desirable to employ multiple Cu pads and studs in a bonding scheme (see, for example, FIG. 12, described below).

Figure 2A:
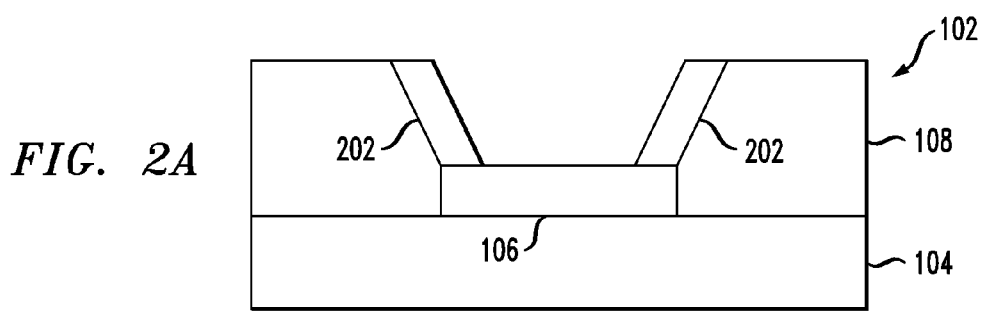
FIG. 2A is a cross-sectional diagram illustrating the sidewalls of via of FIG. 1 having been lined with a Cu liner according to an embodiment of the present invention.

FIG. 2A is a cross-sectional diagram illustrating the sidewalls of via 110 having been lined with a Cu liner 202. According to an exemplary embodiment, Cu liner 202 is formed using a plating process or a sputtering process. Each of these deposition processes are known to those of skill it the art and thus are not described further herein. After deposition of the Cu liner, CMP is then used to remove any unwanted Cu from the top surface of the first bonding structure. As will be described in detail below, by Cu lining the sidewalls of the via a larger interface is present for bonding which permits scaling and reduces bonding resistance penalty.

Figure 2B:
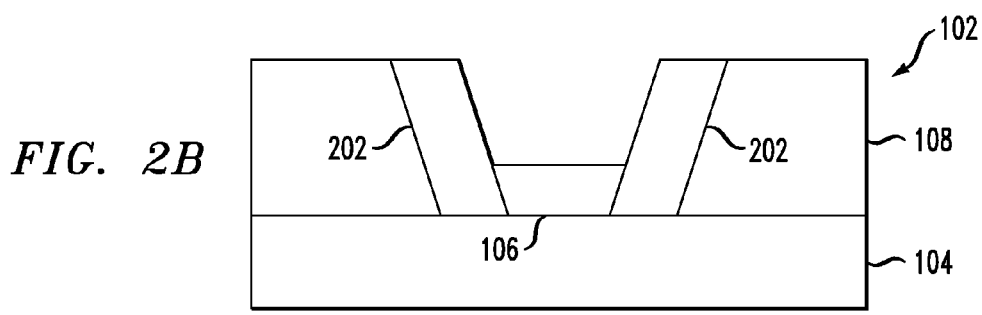
FIG. 2B is a cross-sectional diagram illustrating the Cu pad of FIG. 1 and a Cu liner having been formed simultaneously in a single step according to an embodiment of the present invention.

Alternatively, Cu pad 106 and Cu liner 202 can be formed in one step (rather than in two steps as is shown in FIG. 1 and FIG. 2A). This alternative embodiment is shown in FIG. 2B. In this example, Cu pad 106 and Cu liner 202 are formed simultaneously using the same plating or sputtering process. A via having tapered sidewalls is formed (e.g., in the additional oxide material) as described in conjunction with the description of FIG. 1, above, except that the Cu pad is not in place prior to the via being formed. Cu is then deposited (plated or sputtered) into the via forming the Cu pad and liner. After deposition of the Cu, CMP is used to remove any unwanted Cu from the top surface of the first bonding structure.

By comparison with the two-step embodiment of FIG. 1/FIG. 2A, in the one step process of FIG. 2B the Cu pad and the Cu liner are of a uniform thickness (by comparison in FIG. 2A the Cu pad is thicker than the Cu liner). Either the process shown illustrated in FIG. 1/FIG. 2A or the process shown illustrated in FIG. 2B is acceptable for use with the present techniques. One advantage of the one-step process (of FIG. 2B) is the reduction in the number of production steps which can cut down on production time and overall production costs. From this point on, the remainder of the process is illustrated using the Cu pad and liner formed using the one-step process (i.e., the pad and liner having a uniform thickness). This selection is however arbitrary and the process would proceed in the same manner whether the Cu pad and liner are formed in a one-step or two-step manner.

Figure 3:
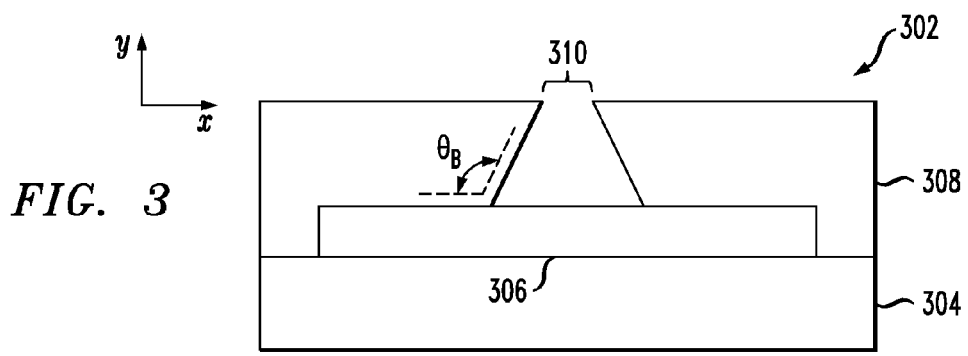
FIG. 3 is a cross-sectional diagram illustrating a second bonding structure having a Cu pad embedded in an insulator and a via formed in the insulator over the Cu pad according to an embodiment of the present invention.

FIG. 3 is a cross-sectional diagram illustrating a second bonding structure 302. As highlighted above, the present techniques as they pertain to this particular embodiment, involve the face-to-face bonding of a bottom structure and a top structure (however other bonding configurations, such as face-to-back bonding, may be employed depending on the particular application at hand). Bonding structure 302 in this specific embodiment is the top bonding structure, which will be flipped for bonding with the bottom bonding structure.

The fabrication of second bonding structure 302 begins, for example, with a wafer having an insulator, i.e., oxide layer 304 (e.g., a $SiO_2$ layer). A substrate (not shown) may be present adjacent to oxide layer 304. Cu is plated onto oxide layer 304 and additional processing, if necessary (such as CMP of the Cu), is performed to form Cu pad 306. Additional insulator (i.e., an additional oxide material 308 (e.g., $SiO_2$)) is deposited over oxide layer 304/Cu pad 306. Cu pad 306 is now embedded in the insulator. A via 310 is then formed in the insulator (in this example, in the additional oxide material) over Cu pad 306. Via 310 can be formed using an oxide-selective RIE with Cu pad 306 acting as an etch stop. According to the exemplary embodiment shown illustrated in FIG. 3, via 310 is formed having sidewalls that are tapered at an angle $\theta_B$ of greater than 90 degrees relative to a plane x (i.e., a surface plane) of the second bonding structure. RIE techniques for producing a via with tapered sidewalls were described above.

Figure 4:
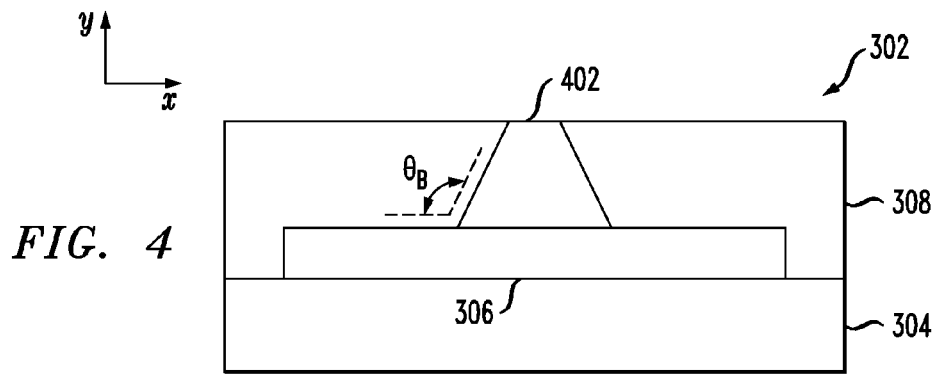
FIG. 4 is a cross-sectional diagram illustrating a Cu stud having been formed within the via of the second bonding structure (of FIG. 3) according to an embodiment of the present invention.

FIG. 4 is a cross-sectional diagram illustrating a Cu stud 402 having been formed in the second bonding structure. Specifically, according to an exemplary embodiment, Cu is plated over the structure, filling via 310. The Cu is then planed to the surface of additional oxide material 308, e.g., using CMP, forming Cu stud 402. It is notable that since Cu stud 402 is formed within via 310, Cu stud 402 also has tapered sidewalls, i.e., at an angle $\theta_B$ of greater than 90 degrees (see FIG. 4) relative to a plane x (i.e., a surface plane) of the second bonding structure. As will become apparent from the following description, Cu stud 402 is tapered to complement the tapered sidewalls of via 110 in the first bonding structure, such that via 110 and Cu stud 402 fit together like a lock-and-key.

Figure 5:
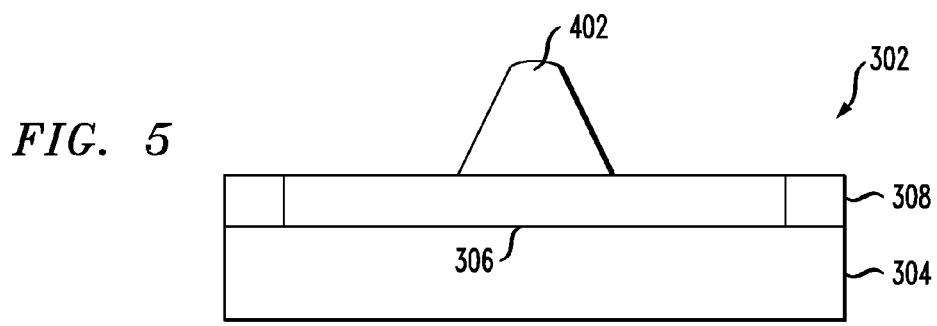
FIG. 5 is a cross-sectional diagram illustrating the insulator of the second bonding structure (of FIG. 4) having been planed down to the surface of the Cu pad to expose the Cu stud according to an embodiment of the present invention.

FIG. 5 is a cross-sectional diagram illustrating additional oxide material 308 having been planed down to the surface of Cu pad 306, e.g., using an oxide-CMP. This process effectively exposes Cu stud 402 for bonding. Further, as shown in FIG. 5, the tip of Cu stud 402 has become rounded by this process. Specifically, in the process of removing additional oxide material 308 using the oxide-CMP, Cu stud 402 will be rounded by the force of the CMP. A rounded tip will help to have large effective bonding pressure and as a result better bonding quality. While second bonding structure 302 is shown to have a single Cu pad 306/Cu stud 402, it is to be understood that multiple pads/studs may be fabricated on a single bonding structure using the techniques as described herein. In fact, in some implementations it may be desirable to employ multiple Cu pads and studs in a bonding scheme (see, for example, FIG. 12, described below).

Figure 6:
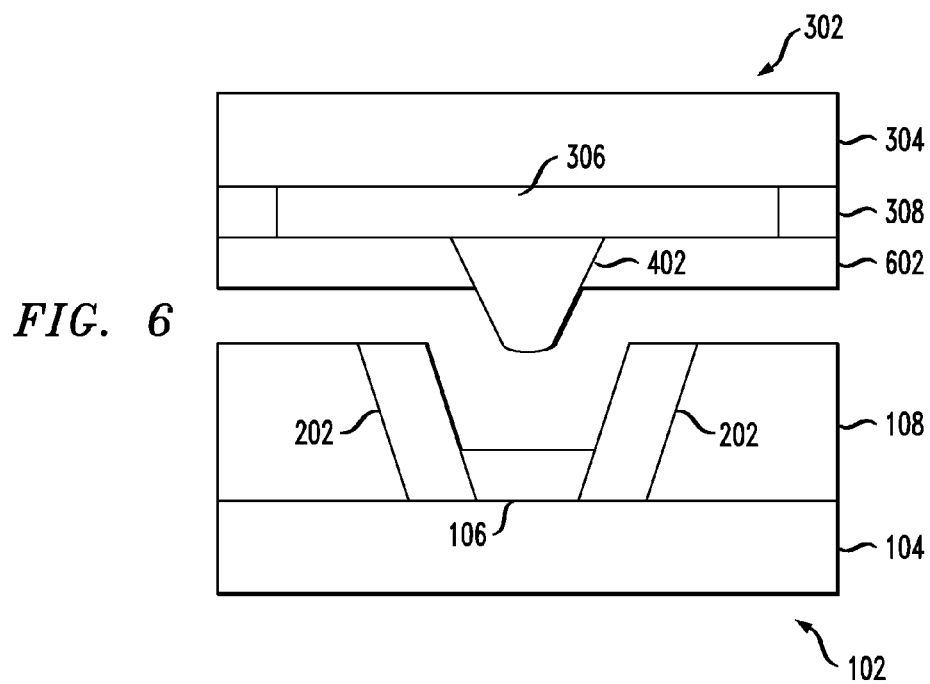
FIG. 6 is a cross-sectional diagram illustrating the first bonding structure (of FIG. 2B) and the second bonding structure (of FIG. 5) lined up for face-to-face bonding according to an embodiment of the present invention.

FIG. 6 is a cross-sectional diagram illustrating first bonding structure 102 and second bonding structure 302 lined up for face-to-face bonding between Cu pad 106/Cu liner 202 and Cu stud 402, respectively. Cu liner 202 and Cu stud 402 have complementarily tapered sidewalls (i.e., at angles of less than 90 degrees and greater than 90 degrees, respectively) and will engage each other, like a lock-and-key.

An adhesive material 602 may be added adjacent to Cu pad 306 and around Cu stud 402. This adhesive material is optional. Suitable adhesive materials include, but are not limited to one or more of Benzocyclobutene (BCB) and Polyimide. The adhesive material may be blanket deposited on the bonding structure using any suitable conventional deposition process. The adhesive material may then be removed from areas that need to be exposed for bonding, such as from the Cu pad and/or from the Cu stud. This selective removal of the adhesive material can be accomplished using standard lithography and etching (e.g., RIE) processes. The result is shown in FIG. 6.

When an adhesive material is used between the bonding structures, the transfer-join bonding is a mechanical lock-and-key and metal (e.g., Cu)/adhesive hybrid design. Better bonding strength is provided by the adhesive material in non-Cu areas of the structure, while Cu/Cu thermocompressive bonding provides both electrical connectivity and bonding strength to the structure.

Figure 7:
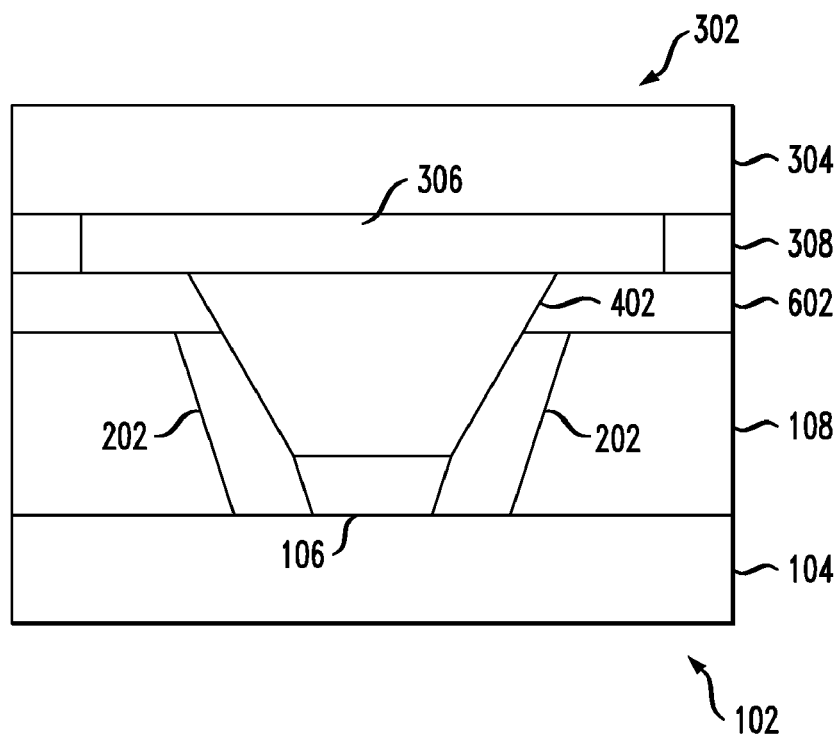
FIG. 7 is a cross-sectional diagram illustrating the first bonding structure (of FIG. 2B) and the second bonding structure (of FIG. 5) bonded together in a face-to-face manner according to an embodiment of the present invention.

FIG. 7 is a cross-sectional diagram illustrating first bonding structure 102 and second bonding structure 302 bonded together in a face-to-face manner via a Cu—Cu bond between Cu pad 106/Cu liner 202 and Cu stud 402, respectively. The Cu—Cu bond can be formed using conventional thermocompression bonding, the parameters of which would be apparent to one of skill in the art and thus are not described further herein. By engineering Cu stud 402 into a tip-like triangle shape, as according to the present techniques, a larger effective local pressure will be transferred to the bonding interface at a given tool bonding pressure. Thus, the drawbacks associated with tooling limitations and/or maximum process pressure impact to the device can be circumvented. As a result, transfer-join bonding can be scaled into smaller pitches.

Further, by using a Cu liner (i.e., Cu liner 202) on the sidewalls of the via (i.e., via 110) in the first wafer, a larger bonding interface is formed under Cu—Cu thermocompression. Namely, as shown in FIG. 7, upon application of force to bond the two structures, Cu stud 402 spreads out to fill via 110 and as a result contacts both Cu pad 106 and Cu liner 202. Namely, under thermocompression Cu stud 402 deforms becoming shorter vertically and wider laterally, and thereby contacts both Cu pad 106 and Cu liner 202. Advantageously, with this present design, transfer-join bonding can be scaled into smaller pitches while minimizing bonding resistance penalty. The present designs provide larger bonded area and, as a result, better bonding reliability and reduced resistance penalty when bonding structure pitch is scaled or bonding structure density is increased.

Figure 8:
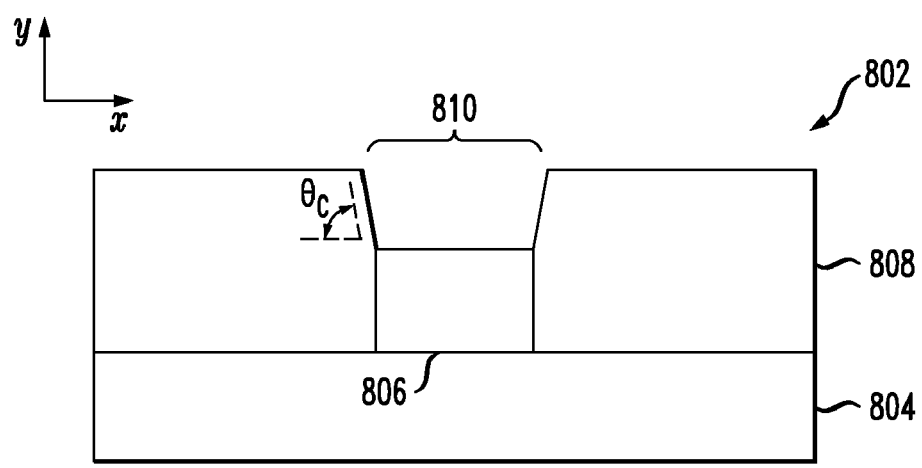
FIG. 8 is a cross-sectional diagram illustrating a first bonding structure having a low melting point metal pad embedded in an insulator and a via in the insulator over the metal pad according to an embodiment of the present invention.
Figure 9:
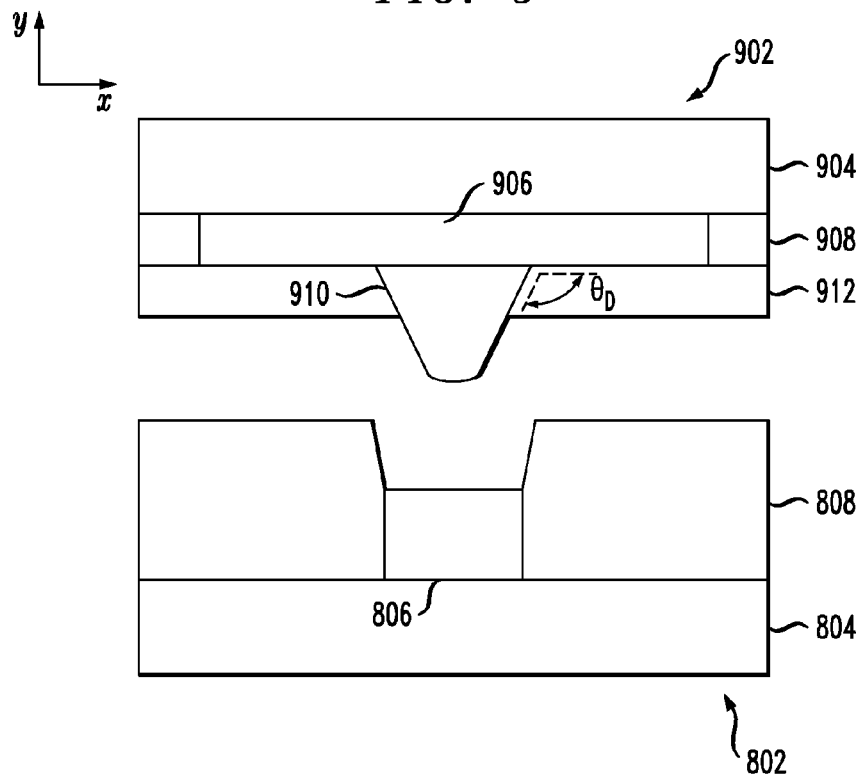
FIG. 9 is a cross-sectional diagram illustrating the first bonding structure (of FIG. 8) and a second bonding structure lined up for face-to-face bonding according to an embodiment of the present invention.
Figure 10:
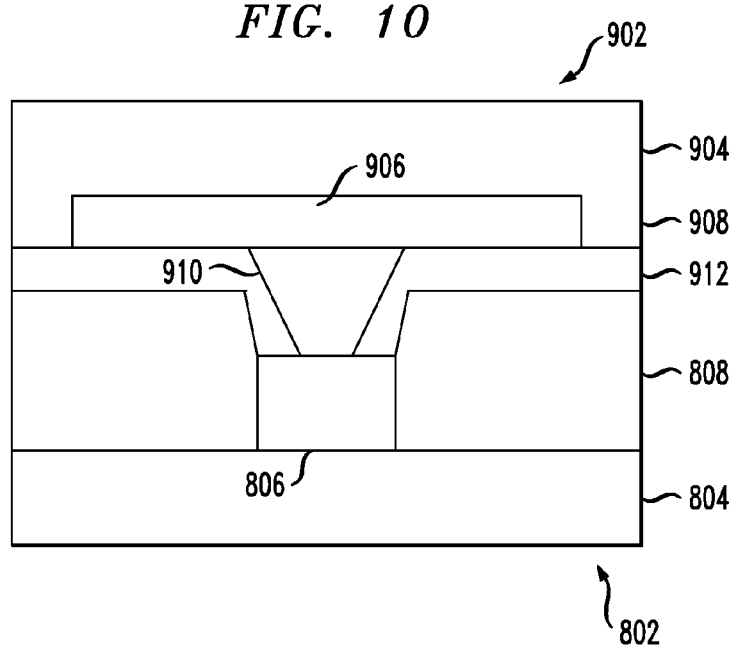
FIG. 10 is a cross-sectional diagram illustrating the first bonding structure (of FIG. 8) and the second bonding structure (of FIG. 9) bonded together in a face-to-face manner according to an embodiment of the present invention.

FIGS. 8-10 provide an exemplary transfer-join lock-and-key design that incorporates low melting point materials that can melt and reflow at bonding temperatures thereby achieving a larger bonding interface (which, as highlighted above, permits scaling of transfer-join bonding to smaller pitches without bonding resistance penalty). FIG. 8, for example, is a cross-sectional diagram illustrating a first bonding structure 802 having low melting point metal pad 806. First bonding structure 802 can be, for example, a wafer or a chip, such that the present techniques can involve the bonding of a wafer pair, a chip pair or a wafer/chip pair.

This particular example involves the fabrication of two separate bonding structures that are then bonded together using a transfer-join lock-and-key design that involves metal-to-metal (i.e., low melting point metal-to-Cu)/adhesive hybrid bonding. As above, to schematically illustrate the process, each bonding structure is considered to have a top surface (or face) and a bottom surface (or back). FIGS. 8-10 illustrate a face-to-face bonding procedure, however what is shown in FIGS. 8-10 is only one exemplary bonding configuration, and other bonding configurations, such as face-to-back bonding, may be implemented in the same manner. The specific bonding configuration employed, i.e., face-to-face, face-to-back, etc., depends on the particular application at hand and can, given the present teachings, be implemented by one of skill in the art.

The fabrication of first bonding structure 802 begins, for example, with a wafer having an insulator, i.e., oxide layer 804 (e.g., a $SiO_2$ layer). A substrate (not shown) may be present adjacent to oxide layer 804. A low melting point metal is then plated onto oxide layer 804 and additional processing, if necessary (such as CMP of the metal), is performed to form metal pad 806. Suitable low melting point metals include metals that have a melting point that is less than the temperature used for bonding, i.e., less than about 400 degrees Celsius (° C.), such as tin (Sn), indium (In), gold (Au), lead (Pb), silver (Ag), alloys containing at least one of the foregoing metals and/or alloys containing at least one of the foregoing metals and Cu. This will ensure that the metal reflows during bonding of the structures. Melting point and thermal conductivity data of some suitable low melting point metals for use in the present techniques are given in FIG. 11, described below.

Additional insulator, i.e., additional oxide material 808 (e.g., $SiO_2$), is deposited over oxide layer 804/metal pad 806. Metal pad 806 is now embedded in the insulator. A via 810 is then formed in the insulator (in this example, in the additional oxide material) over metal pad 806. Via 810 can be formed using an oxide-selective RIE with metal pad 806 acting as an etch stop. According to the exemplary embodiment shown illustrated in FIG. 8, via 810 is formed having sidewalls that are tapered at an angle $\theta_C$ of less than 90 degrees relative to a plane x (i.e., a surface plane) of the first bonding structure. To achieve the tapered sidewalls by RIE, for example, the mix of chemistry can be changed, e.g., less tetrafluoromethane ($CF_4$), or the bias power during the RIE can be reduced. Accordingly, the sidewalls of the via can have more or less taper.

While first bonding structure 802 is shown to have a single metal pad embedded in a via having sidewalls that are tapered at an angle $\theta_C$ of less than 90 degrees, it is to be understood that multiple pads/vias may be fabricated on a single bonding structure using the techniques as described herein. In fact, in some implementations it may be desirable to employ multiple metal pads and studs in a bonding scheme (see, for example, FIG. 12, described below).

FIG. 9 is a cross-sectional diagram illustrating first bonding structure 802 and a second bonding structure 902 lined up for face-to-face bonding. Second bonding structure 902 can be fabricated using the techniques described, for example, in conjunction with the description of FIGS. 3-5, above. In fact, in some embodiments, the configuration of second bonding structure 902 as shown in FIG. 9 is the same as second bonding structure 302 as shown in FIG. 5. Namely, second bonding structure 902 includes an insulator, i.e., oxide layer 904 (e.g., an $SiO_2$ layer), a Cu pad 906, additional insulator, i.e., additional oxide material 908 (e.g., $SiO_2$), adjacent to oxide layer 904 and surrounding Cu pad 906 and a Cu stud 910 that has tapered sidewalls, i.e., at an angle $\theta_D$ of greater than 90 degrees relative to a plane x (i.e., a surface plane) of the second bonding structure, and a rounded tip. As will become apparent from the following description, Cu stud 910 is tapered to complement the tapered sidewalls of via 810 in the first bonding structure, such that via 810 and Cu stud 910 fit together like a lock-and-key.

An adhesive material 912 is added adjacent to Cu pad 906 and around Cu stud 910 (e.g., blanket coated and then cleaned from bonding areas using lithography and RIE, see above). Suitable adhesive materials include, but are not limited to BCB and/or polyimide. Accordingly, the transfer-join bonding is a mechanical lock-and-key and metal (e.g., low temperature metal)/adhesive hybrid design.

FIG. 10 is a cross-sectional diagram illustrating first bonding structure 802 and second bonding structure 902 bonded together in a face-to-face manner via a hybrid metal-to-metal bond (i.e., between metal pad 806 and Cu stud 910, respectively)/adhesive bond (via adhesive material 912). The metal-to-metal bond can be formed using conventional thermocompression bonding, the parameters of which would be apparent to one of skill in the art and thus are not described further herein. By engineering Cu stud 910 into a tip-like triangle shape, as according to the present techniques, a larger effective local pressure will be transferred to the bonding interface at a given tool bonding pressure. Thus, the drawbacks associated with tooling limitations and/or maximum process pressure impact to the device can be circumvented. As a result, transfer-join bonding can be scaled into smaller pitches.

The low melting point metal(s) making up metal pad 806 will, in this example, reflow during the thermocompression bonding. As a result, Cu/low melting point metal alloy (such as Cu/Sn) will form around Cu stud 910 thus producing a larger bonding interface. Therefore, transfer-join bonding can be scaled into smaller pitches without bonding resistance penalty. With the low melting point metal(s), Cu stud 910 will not spread out as much upon bonding as compared with the embodiment shown illustrated, for example, in FIG. 7, described above. Accordingly, adhesive material 912 serves to fill any gaps between the structures, i.e., within via 810.

Figures 11, 12:
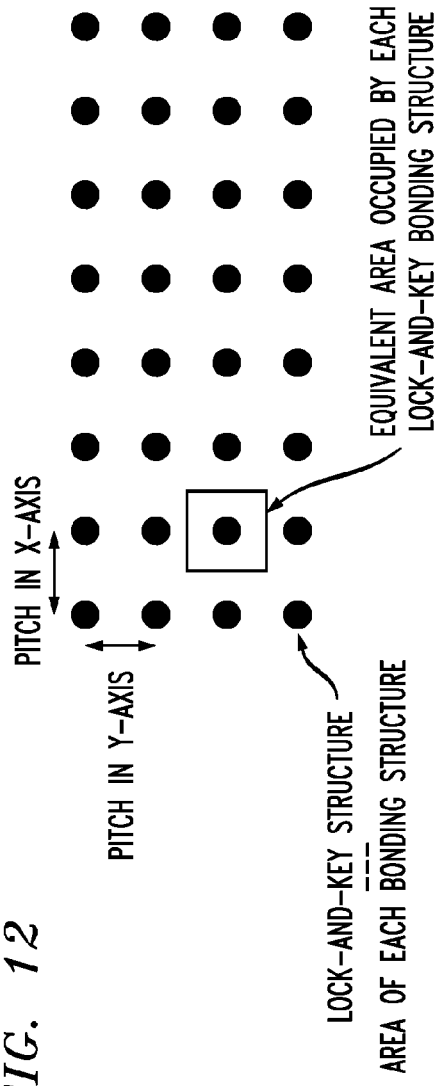
FIG. 11 is a table illustrating initial melting point and thermal conductivity values for several suitable low temperature metals according to an embodiment of the present invention.
FIG. 12 is a schematic diagram illustrating an array of the present transfer-join lock-and-key structures according to an embodiment of the present invention.

FIG. 11 is a table 1100 illustrating the initial melting point (measured in ° C.) and thermal conductivity (measured in Watts per meter Kelvin W/mK) values for several suitable low melting point metals. Materials with good thermal conductivity help heat dissipation.

FIG. 12 is a schematic diagram illustrating an array of the present transfer-join lock-and-key structures, i.e., present Cu pad/liner/stud or low melting point metal pad/Cu stud lock-and-key structures. FIG. 12 illustrates a pitch of the lock-and-key structures in the x-axis and in the y-axis and the equivalent area occupied by each lock-and key bonding structure. From FIG. 12 it can be seen that as the pitch decreases the equivalent area occupied by each lock-and-key structure also decreases. Thus, notably, the transfer-join lock-and-key structure configurations presented herein permit a larger effective local pressure to be transferred to the bonding interface at a given tool bonding pressure. Thus, the drawbacks associated with tooling limitations and/or maximum process pressure impact to the device can be circumvented. As a result, transfer-join bonding can be scaled into these smaller pitches.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A transfer-join bonding method, comprising the steps of:
   providing a first bonding structure having at least one metal pad embedded in an insulator and at least one via in the insulator over the metal pad, wherein the via has tapered sidewalls;
   providing a second bonding structure having at least one copper stud adapted to have a taper that complements the tapered sidewalls of the via, such that the via and the copper stud fit together like a lock-and-key; and
   bonding the first bonding structure to the second bonding structure by way of a metal-to-metal bonding between the metal pad and the copper stud that deforms the copper stud.

2. The method of claim 1, further comprising the step of:
   lining sidewalls of the via with copper.

3. The method of claim 1, wherein the sidewalls of the via are tapered at an angle of less than 90 degrees relative to a surface plane of the first bonding structure.

4. The method of claim 1, wherein the copper stud is tapered at an angle of greater than 90 degrees relative to a surface plane of the second bonding structure.

5. The method of claim 1, wherein the metal pad comprises copper.

6. The method of claim 1, wherein the metal pad comprises a low melting point metal.

7. The method of claim 6, wherein the low melting point metal has a melting point that is less than about 400 degrees Celsius.

8. The method of claim 6, wherein the low melting point metal comprises one or more of tin, indium, gold, lead, silver, alloys containing at least one of the foregoing metals and alloys containing at least one of the foregoing metals and copper.

9. The method of claim 1, further comprising the step of:
adding an adhesive material around at least a portion of the copper stud.

10. The method of claim 1, wherein the first bonding structure comprises a wafer or a chip and the second bonding structure comprises a wafer or a chip.

11. A transfer-join bonded structure, comprising:
a first bonding structure having at least one metal pad embedded in an insulator and at least one via in the insulator over the metal pad, wherein the via has tapered sidewalls; and
a second bonding structure having at least one copper stud adapted to have a taper that complements tapered to complement the tapered sidewalls of the via, such that the via and the copper stud fit together like a lock-and-key,
wherein the first bonding structure and the second bonding structure are bonded together by way of a metal-to-metal bonding between the metal pad and the copper stud that deforms the copper stud.

12. The structure of claim 11, further comprising:
a copper liner lining sidewalls of the via.

13. The structure of claim 11, wherein the sidewalls of the via are tapered at an angle of less than 90 degrees relative to a surface plane of the first bonding structure.

14. The structure of claim 11, wherein the copper stud is tapered at an angle of greater than 90 degrees relative to a surface plane of the second bonding structure.

15. The structure of claim 11, wherein the metal pad comprises copper.

16. The structure of claim 11, wherein the metal pad comprises a low-melting point metal.

17. The structure of claim 16, wherein the low melting point metal has a melting point that is less than about 400 degrees Celsius.

18. The structure of claim 16, wherein the low melting point metal comprises one or more of tin, indium, gold, lead, silver, alloys containing at least one of the foregoing metals and alloys containing at least one of the foregoing metals and copper.

19. The structure of claim 11, further comprising;
an adhesive material between the first bonding structure and the second bonding structure.

20. The structure of claim 11, wherein the first bonding structure comprises a wafer or a chip and the second bonding structure comprises a wafer or a chip.

* * * * *